United States Patent [19]

Konotsune et al.

[11] Patent Number: 5,192,619
[45] Date of Patent: Mar. 9, 1993

[54] FLEXIBLE COPPER-APPLIED SUBSTRATES

[75] Inventors: Shiro Konotsune, Yokosuka; Kazutsune Kikuta; Masaya Uetsuki, both of Yokohama; Hiroaki Hase, Kawasaki, all of Japan

[73] Assignee: Chisso Corporation, Osaka, Japan

[21] Appl. No.: 787,624

[22] Filed: Nov. 4, 1991

Related U.S. Application Data

[63] Continuation of Ser. No. 367,255, Jun. 16, 1989, abandoned.

[30] Foreign Application Priority Data

Jun. 30, 1988 [JP] Japan .................................. 63-162982
Aug. 29, 1988 [JP] Japan .................................. 63-214185

[51] Int. Cl.$^5$ .................... B32B 15/08; B32B 27/06; C08G 77/04
[52] U.S. Cl. .................... 428/458; 428/473.5; 428/901; 528/26
[58] Field of Search .................... 428/209, 458, 473.5, 428/901; 528/26

[56] References Cited

U.S. PATENT DOCUMENTS

| | | | |
|---|---|---|---|
| 4,609,700 | 9/1986 | Kunimune et al. | 528/26 |
| 4,656,238 | 4/1987 | Kunimune et al. | 528/26 |
| 4,672,099 | 6/1987 | Kunimune et al. | 528/26 |
| 4,818,806 | 4/1989 | Kunimune et al. | 528/26 |

FOREIGN PATENT DOCUMENTS

| | | |
|---|---|---|
| 89387 | 9/1983 | European Pat. Off. . |
| 133533 | 2/1985 | European Pat. Off. . |
| 189643 | 8/1986 | European Pat. Off. . |
| 194865 | 9/1986 | European Pat. Off. . |
| 270672 | 6/1988 | European Pat. Off. . |
| 111182 | 5/1986 | Japan . |

*Primary Examiner*—George F. Lesmes
*Assistant Examiner*—Terrel Morris
*Attorney, Agent, or Firm*—Fred Philpitt

[57] ABSTRACT

A flexible copper-applied substrate comprises a copper foil and a resin layer comprising a composite material of a polyimide and a polyimide silicone, the resin layer being directly formed on the surface of the copper foil, said substrate being producible by applying a polyamide acid composite composed of a mixed solution of a polyamide acid and a polyamide acid alkylsilane to a copper foil and heating.

8 Claims, No Drawings

FLEXIBLE COPPER-APPLIED SUBSTRATES

This is a continuation of application Ser. No. 07/367,255, filed Jun. 16, 1989, now abandoned and the benefits of 35 USC 120 are claimed relative to it.

BACKGROUND OF THE INVENTION

1. Field of the Invention

The present invention relates to flexible copper-applied substrates having excellent dimensional stability and adhesive properties.

2. Description of the Prior Art

Flexible copper-applied substrates are etched to form circuits, and various electronic parts are mounted on the circuits. Afterward, the circuits are incorporated in a system. In recent years, the mounting density of the parts on this type of circuit substrates is increased more and more, and the mounting procedure is also apt to be automated. The mounting is made under high-temperature conditions, e.g., by the use of automatic soldering, and therefore the substrates are required to have heat resistance. In addition, in the process of forming the circuits, the substrates suffer chemical and thermal changes such as etching and washing, and so it is necessary that they maintain their original plane form without curling and without peeling of copper from films.

In most cases, conventional polyimide flexible print substrates comprise polyimide films and copper foils applied thereon through an adhesive. However, with regard to this type of substrates, their heat resistance and electrical characteristics change with time inconveniently because of using the adhesive, and for this reason, these substrates can scarcely be applied to high-density circuits and automatic mounting systems. In order to solve these problems, some techniques have been suggested which are a method for thermally fusing polyimide films on copper foils (Japanese Patent Laid-open No. 181857/1982) and a method which comprises coating copper foils with a polyimide precursor solution, and then heating them to form polyimide films thereon (Japanese Patent Laid-open No. 111359/1986).

These improvement methods, since using no adhesive, can provide the substrates having good heat resistance and electrical characteristics, but the former method just described requires a thermal fusing step and other relative steps, and thus the same or more treatment steps as in the conventional case are necessary. Furthermore, there is the problem that when the polyimide films which have undergone the thermal fusing treatment at a high temperature are cooled to room temperature, the substrates tend to curl owing to a difference between thermal expansion coefficients of the resin and the copper foil. On the other hand, the latter method described above has no step of preparing any film, and the steps of this method can be simplified. However, since a high temperature is required in the polyimide formation step, the substrates are similarly apt to curl when cooled to room temperature. In addition, there is also the problem that adhesive strength between the polyimide film and the copper foil is not sufficient.

As discussed above, in the already suggested methods, the substrates tend to curl when the adhesive strength of the polyimide to the copper foil is heightened, and the adhesive strength deteriorates when the thermal expansion coefficient is controlled. In consequence, the known methods which have such problems are not sufficiently practical.

SUMMARY OF THE INVENTION

An object of the present invention is to provide substrates which have high adhesive strength and which scarcely curl, and another object of the present invention is to provide a process for preparing these substrates. Therefore, according to the present invention, the above-mentioned problems can be solved.

A first feature of the present invention is directed to a flexible copper-applied substrate which comprises a copper foil and a resin layer comprising a composite material of a polyimide having a repeating unit represented by the following general formula (I) and a polyimide silicone having a repeating unit represented by the following general formula (II), the aforesaid resin layer being directly formed on the surface of the copper foil:

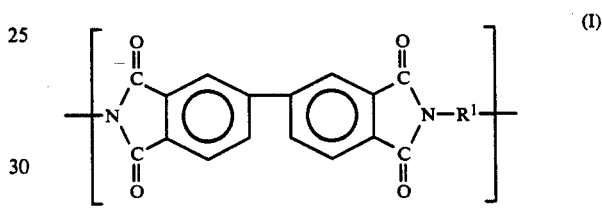

(I)

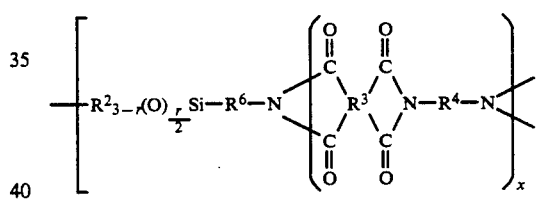

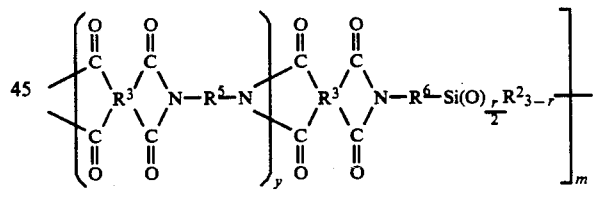

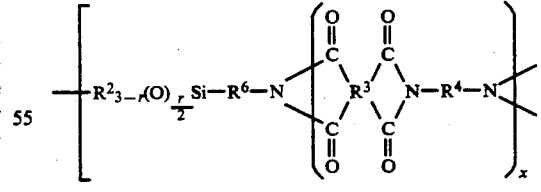

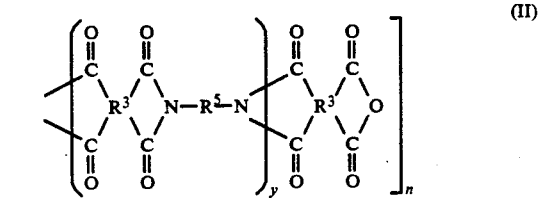

(II)

wherein $R^1$ is an aromatic hydrocarbon group of

$R^2$ is an aliphatic hydrocarbon group having 5 or less carbon atoms or an aromatic hydrocarbon group having 9 or less carbon atoms, $R^3$ is a tetravalent aromatic hydrocarbon group, $R^4$ is a divalent aromatic hydrocarbon group, $R^5$ is a divalent siloxane chain, $R^6$ is a divalent aliphatic hydrocarbon group having 3 to 5 carbon atoms or a divalent aromatic hydrocarbon group having 6 to 9 carbons atoms, Y is —O—, —CO—, —SO$_2$— or —CH$_2$—, r is 2 or 3, x:y is 97–60:3–40, and m:n is 50–100:50–0.

A second feature of the present invention is directed to a flexible copper-applied substrate regarding the first feature of the present case wherein $R^1$ is composed of 5 to 30 mole % of

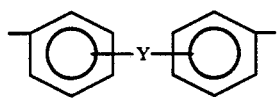

and 70 to 95 mole % of

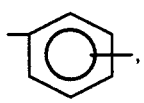

$R^2$ is a methyl group or a phenyl group, and $R^5$ is a group having the formula (V)

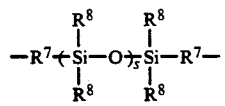

wherein $R^7$ is a divalent aliphatic hydrocarbon group having 3 to 5 carbon atoms or a divalent aromatic hydrocarbon group having 6 to 9 carbon atoms, $R^8$ is an aliphatic hydrocarbon group having 1 to 3 carbon atoms or an aromatic hydrocarbon group having 6 to 9 carbon atoms, and s is an integer of 3 to 150.

A third feature of the present invention is directed to a process for preparing a flexible copper-applied substrate of the first feature regarding the present case which comprises the steps of coating a copper foil with a polyimide acid composite solution prepared by mixing a solution of a polyimide acid having a repeating unit represented by the general formula (III) with a solution of a polyamide acid alkylsilane represented by the general formula (IV), and then heating the copper foil coated with the polyamic acid composite solution:

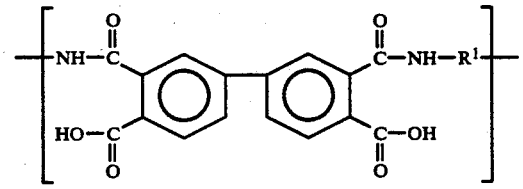

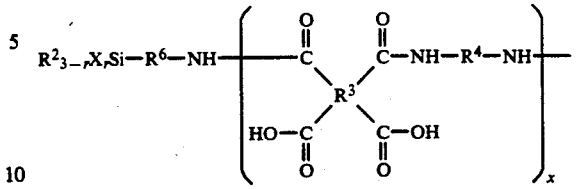

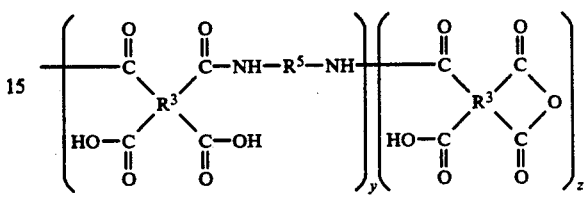

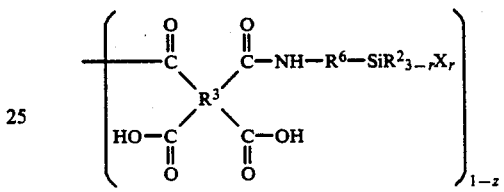

wherein $R^1$, $R^2$, $R^3$, $R^4$, $R^5$, $R^6$, r, x and y are as defined above, X is a hydrolyzable alkoxy group, an acetoxy group or a halogen group, and z is a value of 0 to 0.5.

A fourth feature of the present invention is directed to a process for preparing a flexible copper-applied substrate regarding the third feature of the present case wherein $R^1$ is composed of 5 to 30 mole % of

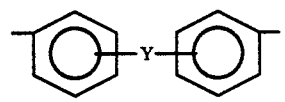

and 70 to 95 mole % of

$R^2$ is a methyl group or a phenyl group; and $R^5$ is a group having the formula (V)

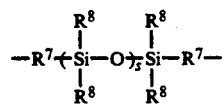

wherein $R^7$ is a divalent aliphatic hydrocarbon group having 3 to 5 carbon atoms or a divalent aromatic hydrocarbon group having 6 to 9 carbon atoms, $R^8$ is an aliphatic hydrocarbon group having 1 to 3 carbon atoms or an aromatic hydrocarbon group having 6 to 9 carbon atoms, Y is as defined above, and s is an integer of 3 to 150.

DETAILED DESCRIPTION OF THE INVENTION

A flexible copper-applied substrate of the present invention not only has high adhesive strength between a polyimide and a copper foil but also prevents curling substantially, and therefore it is practically valuable. This is attributable to a synergistic effect obtained from the composite material in which a polyimide chain of a stiff structure having a controlled linear expansion coefficient is firmly combined with a crosslinked polyimide having a flexible structure.

A polyamide acid (III) used in the present invention may be prepared by reacting 3,4,3',4'-biphenyltetracarboxylic acid dianhydride represented by the formula (VI)

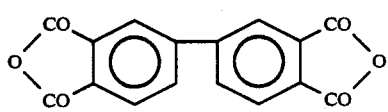

with phenylenediamine represented by the general formula (VII)

and an aromatic diamine represented by the general formula (VIII)

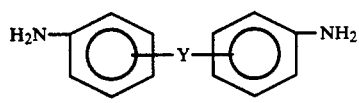

in a polar organic solvent.

Examples of the phenylenediamine used herein include paraphenylenediamine, metaphenylenediamine and orthophenylenediamine, but for the purpose of the present invention, paraphenylenediamine and a mixture of paraphenylenediamine and metaphenylenediamine can be suitably used. Furthermore, examples of the aromatic diamine represented by the formula (VIII) include 4,4'-diaminodiphenyl ether, 3,4'-diaminodiphenyl ether, 3,3'-diaminodiphenyl ether, 4,4'-diaminodiphenyl sulfone, 3,4'-diaminodiphenylsulfone, 4,4'-diaminodiphenyl ketone and 4,4'-diaminodiphenylmethane, but for the purpose of the present invention, 4,4'-diaminodiphenyl ether, 3,3'-diaminodiphenyl ether, 3,4'-diaminodiphenyl ether and mixtures thereof are suitable. The amounts of the above-mentioned diamines to be used are preferably such that a molar ratio of the diamine represented by the formula (VII) to the diamine represented by the formula (VIII) is in the range of 70–95:30–5.

Furthermore, the polyamide acid represented by the general formula (IV) may be prepared by reacting an aromatic tetracarboxylic dianhydride represented by the following general formula (IX), an aromatic diamine represented by the following general formula (X), α,ω-diaminosilicone represented by the general formula (XI) and an aminoalkylsilane represented by the following general formula (XII) in an organic solvent:

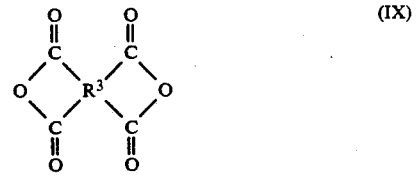

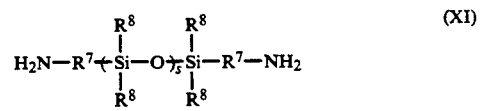

Typical exmaples of the aromatic tetracarboxylic acid dianhydride represented by the formula (IX) include pyromellitic acid dianhydride 3,4,3',4'-biphenyltetracarboxylic acid dianhydride, 3,4,3',4'-benzophenonetetracarboxylic acid dianhydride, 2,3,3',4'-benzophenonetetracarboxylic acid dianhydride, bis(3,4-dicarboxyphenyl)-ether dianhydride and bis(3,4-dicarboxyphenyl)-sulfone dianhydride. These carboxylic dianhydrides can be signly or in combination.

Moreover, typical examples of the aromatic diamine represented by the formula (X) include paraphenylenediamine, metaphenylenediamine, 4,4'-diaminodiphenyl ether, 3,4'-diaminodiphenyl ether, 3,3'-diaminodiphenyl ether, 4,4'-diaminodiphenyl ketone, 3,4'-diaminodiphenyl ketone, 4,4'-diaminodiphenylsulfone, 4,4'-diaminobiphenyl, 3,4'-diaminobiphenyl, 4,4'-diaminodiphenylmethane, 2,2'-bis(4-aminophenyl)propane, 1,4-di(4-aminophenyl)phenyl ether and 1,3-di(4-aminophenyl)phenyl ether. Furthermore, examples of α,ω-diaminosilicone represented by the general formula (XI) include the following compounds:

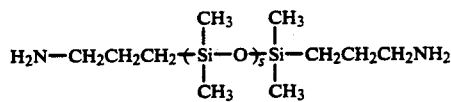

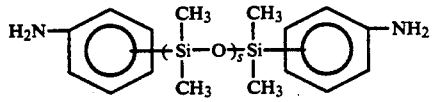

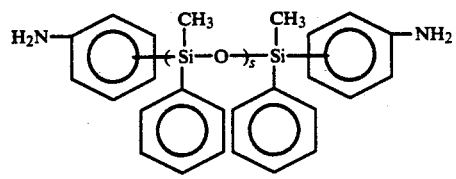

-continued

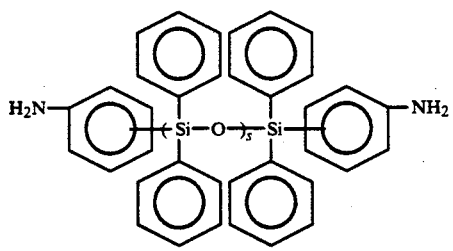

The amount of α,ω-diaminosilicone is preferably used in an amount of 3 to 40 mole % based on the total weight of all the diamines [the total of the aromatic diamine (X) and α,ω-diaminosilicone (XI)].

Typical examples of the aminoalkylsilane represented by the formula (XII) include the following compounds:

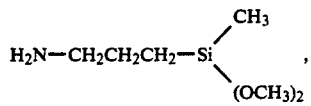
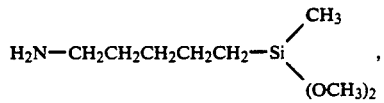
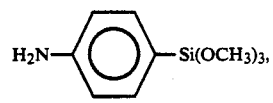
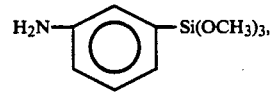
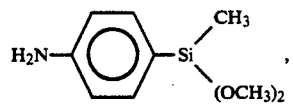
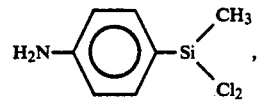
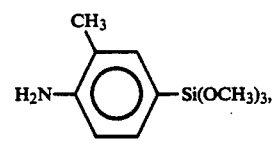
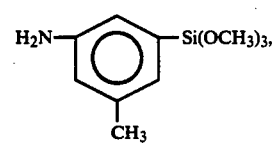

-continued

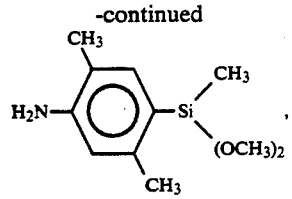

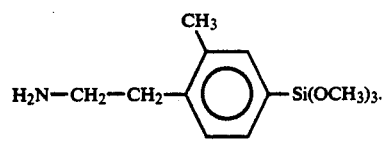

Of these compounds, what are particularly suitable for the purpose of the present invention are paraaminophenyltrimethoxysilane, metaaminophenyltrimethoxysilane, a mixture of paraminophenytrimethoxysilane and metaaminophenyltrimethoxysilane and paraaminophenyl-methyldimethoxysilane.

The amount of the aminoalkylsilane to be used is from 0.5 to 20 mole %, preferably 1 to 10 mole %, based on the total weight of the diamines.

Examples of the organic solvent used in the synthetic reaction of the polyamide acids (III) and (IV) include polar organic solvents such as N-methyl-2-pyrrolidone, N,N-dimethylacetamide, N,N-dimethylformamide, dimethylsulfoxide, cresol, ethylcarbitol and cyclopentanone, and they can be used singly or in the form of a mixture of two or more thereof. In addition, xylene, toluene, ethylene glycol monoethyl ether or the like may be mixed with the above-mentioned solvent.

Next, reference to synthetic conditions will be made. In the case that the polyamide acid (III) is synthesized, the diamines are dissolved in the polar solvent, and the diamino compounds and the equimolar tetracarboxylic dianhydride are added thereto in sequence with stirring in a nitrogen gas flow. Temperature is maintained at a level of 0° to 80° C., and the reaction is performed for a period of 1 to 24 hours. The molecular weight of the resulting polyamide acid is preferably such that its inherent viscosity at 30° C. at a concentration of 0.5 g/100 ml in N-methyl-2-pyrrolidone is from 0.7 to 2.

The polyamide acid (IV) may be synthesized by a method in which the diamines (X), (XI) and the aminosilane (XII) are dissolved in an organic solvent, and a predetermined amount of tetracarboxylic dianhydride is further added thereto with stirring in a nitrogen gas flow, and in which the reaction temperature is maintained at a level of 0° to 80° C., and reaciton is performed for a period of 1 to 24 hours. Alternatively, the diamines (X) and (XI) are dissolved in the organic solvent, and a predetermined amount of tetracarboxylic dianhydride is added thereto with stirring in a nitrogen gas flow so as to perform reaction. Afterward, the aminoalkylsilane (XII) is further added thereto, and the reaction is carried out. The amounts of the respective components used in the reaction preferably satisfy the following relations:

$$1 \leq \frac{D}{A - (B + C)} \leq 2$$

$$0.001 \leq \frac{D}{2B + 2C + D} \leq 0.1$$

wherein A, B, C and D represent moles of the tetracarboxylic dianhydride, moles of the aromatic diamine, moles of $\alpha,\omega$-diaminosilicone and moles of the aminoalkylsilane, respectively.

The polyamide acid (IV) obtained by this reaction preferably has an inherent viscosity of 0.05 to 1 at 30° C. at a concentration of 0.5 g/100 ml in N-methyl-2-pyrrolidone.

The polyamide acids (III) and (IV) prepared by the above-mentioned reaction are mixed preferably in a ratio which satisfies the formula $$0.02 \leq \frac{F}{E+F} \leq 0.50$$

more preferably, $$0.05 \leq \frac{F}{E+F} \leq 0.30$$

wherein E and F represent weights of the polyamide acids (III) and (IV), respectively, and if desired, the above-mentioned reaction solvent is added thereto or removed therefrom, in order to form a polyamide acid composite solution, and a copper foil is then coated with the polyamide acid composite solution. A coating technique is not particularly limited, and a comma coating process, an extrusion cast process or the like can be employed.

After the coating step, a thermal treatment is carried out to form a polyimide. In this case, the treatment is stepwise performed at a temperature of 100° to 200° C. for a period of 10 to 90 minutes, and afterward at 200° to 350° C. for 10 to 270 minutes.

The flexible copper-applied substrate of the present invention is more excellent in adhesive strength and curl resistance as compared with a conventional substrate comprising a single polyimide resin layer and a copper foil. That is, in the present invention, the two kinds of polyimide resins are not simply mixed, and a synergistic effect due to the formation of the composite is exhibited. In consequence, according to the present invention, the substrates can be provided which have high adhesive strength and which present curling.

EXAMPLES

Now, the present invention will be described in detail in reference to examples and comparative examples, but the scope of the present case should not be limited to these examples.

Example 1

(1) Synthesis of polyamide acid (A):

A stirrer was set to a 500 milliliter three-necked flask, and the atmosphere in the flask was then replaced with nitrogen. Afterward, 250 ml of purified dimethylacetamide was poured into the flask. Additionally, 8.6 g of paraphenylenediamine and 4.0 g of 4,4'-diaminodiphenyl ether were then added thereto and dissolved therein. After the dissolution, while a reaction temperature was controlled so as not to exceed 10° C., 29.4 g of 3,4,3',4'-biphenyltetracarboxylic acid dianhydride was added thereto little by little with stirring to perform reaction. After completion of the addition, the reaction was carried out at a reaction temperature of 15° C. for 5 hours, so that a polyamide acid solution was obtained. The thus obtained polyamide acid had an inherent viscosity of 1.8 at 30° C. at a concentration of 0.5 g/dl in N-methyl-2-pyrrolidone.

(2) Synthesis of polyamide acid (B):

Into a b 300 milliliter three-necked flask was poured purified 150 ml of N,N-dimethylacetamide, and 3.5 g of paraphenylenediamine and 10.3 g of $\alpha,\omega$-di-(3-aminopropyl)-polydimethylsiloxane were then dissolved therein. After the dissolution, 14.7 g of biphenyltetracarboxylic acid dianhydride was added thereto, and 0.6 g of aminophenyltrimethoxysilane was then added thereto in order to perform reaction. This reaction was carried out with stirring at 15° C. for 5 hours, thereby obtaining a polyamide acid, which had an inherent viscosity of 0.3 at 30° C. at a concentration of 0.5 g/dl in N-methyl-2-pyrrolidone.

(3) Substrate:

The polyamide acid solutions (A) and (B) which had been synthesized in the above-mentioned steps (1) and (2) were mixed uniformly in a polymer weight ratio of 4:1. Afterward, the mixed polyamide acid solution as coated on an electrolytic copper foil by the use of an applicator so that the thickness of the solution layer thereon might be about 100 μm. This copper foil coated with the mixed polyamide acid solution was fixed on a frame and was then heated at 100° C., 150° C. and 250° C., respectively, for 30 minutes and further at 350° C. for 1 hour in an electric oven, thereby preparing a substrate. Adhesive strength between the polyimide film and the copper foil of the substrate was 1.9 kg/cm in terms of peeling strength at an angle of 180°. Moreover, the curling of the substrate was scarcely seen.

Examples 2 to 6

(1) Synthesis of polyamide acid (A):

The synthesis of a polyamide acid (A) was carried out following the same procedure as in the step (1) of Example 1 with the exception that the kinds and amounts of diamine component and kind of solvent were altered as shown in Table 1.

(2) Synthesis of polyamide acid (B):

The synthesis of a polyamide acid (B) was carried out following the same procedure as in the step (2) of Example 1 with the exception that the kinds and amounts of acid anhydride component and diamine component, and kind of solvent were altered as shown in Table 1.

(3) Substrate:

Each substrate was prepared following the same procedure as in the step (3) of Example 1 with the exception that a mixing ratio of the polyamide acid (A) to the polyamide acid (B) was altered as shown in Table 1.

The results of Examples 2 to 6 are set forth in Table 1.

Comparative Examples 1 to 3

(1) Synthesis of polyamide acid:

Into a b 300 milliliter three-necked flask was poured 250 ml of purified solvent, and the atmosphere in the flask was then replaced with nitrogen. Afterward, a predetermined amount of diamine component was added thereto and was then dissolved therein with stirring. After the dissolution, a predetermined amount of an aromatic tetracarboxylic dianhydride was added thereto so as to perform reaction. This reaction was continued at a temperature of 10° C. or less for 5 hours. The molecular weight of each of the thus obtained polymers was represented by an inherent viscosity at 30° C. at a concentration of 0.5 g/100 ml in N-methyl-2-pyrrolidone.

(2) Substrate:

Each of the polyamide acid solutions which had been synthesized in the above-mentioned step (1) was coated on a copper foil having a thickness of 35 μm by the use of an applicator, and the copper foil coated with the polyamide acid solution was then heated at 100° C., 150° C. and 250° C., respectively, for 30 minutes, and further at 350° C. for 1 hour in an electric oven, thereby preparing substrates.

The results in Comparative Examples 1 to 3 are set forth in Table 1.

TABLE 1

| Example | Polyamide Acid (A) | | | Polyamide Acid (B) | | |
|---|---|---|---|---|---|---|
| | Acid Anhydride Component*1 (mole) | Diamine Component*1 (mole) | Inherent Viscosity | Acid Anhydride Component*1 (mole) | Diamine Component*1 (mole) | Inherent Viscosity |
| Example 1 | S-BPDA (0.1) | p-PDA (0.08) 4,4'-DDE (0.02) | 1.8 | S-BPDA (0.05) | p-PDA (0.032) APMS-6 (0.016) p-APS (0.003) | 0.3 |
| Example 2 | S-BPDA (0.1) | p-PDA (0.08) 4,4'-DDE (0.02) | 1.9 | S-BPDA (0.05) | p-PDA (0.041) APMS-6 (0.007) p-APS (0.003) | 0.2 |
| Example 3 | S-BPDA (0.1) | p-PDA (0.065) m-PDA (0.015) 4,4'-DDE (0.02) | 1.5 | S-BPDA (0.05) | p-PDA (0.04) APMS-6 (0.007) p-APS (0.005) | 0.2 |
| Example 4 | S-BPDA (0.1) | p-PDA (0.08) 3,4'-DDE (0.02) | 1.8 | S-BPDA (0.03) BTDA (0.02) | p-PDA (0.03) m-PDA (0.005) APMS-6 (0.012) p-APS (0.003) | 0.3 |
| Example 5 | S-BPDA (0.1) | p-PDA (0.07) 4,4'-DDE (0.01) 3,4'-DDE (0.01) | 1.5 | S-BPDA (0.03) PMDA (0.02) | p-PDA (0.043) APMS-10 (0.004) p-APS (0.003) | 0.2 |
| Example 6 | S-BPDA (0.1) | p-PDA (0.06) m-PDA (0.01) 4,4'-DDE (0.03) | 1.6 | S-BPDA (0.04) BTDA (0.01) | p-PDA (0.03) m-PDA (0.012) APMS-18 (0.007) APSE (0.001) | 0.4 |
| Comp. Example 1 | S-BPDA (0.1) | p-PDA (0.08) 4,4'-DDE (0.02) | 1.8 | — | — | — |
| Comp. Example 2 | PMDA (0.1) | 4,4'-DDE (0.1) | 1.6 | — | — | — |
| Comp. Example 3 | S-BPDA (0.1) | p-PDA (0.07) 4,4'-DDE (0.0295) p-APS (0.0005) | 1.1 | — | — | — |
| Comp. Example 4 | PMDA (0.1) | 4,4'-DDE (0.1) | 1.5 | S-BPDA (0.05) | p-PDA (0.04) APMS-6 (0.008) p-APS (0.002) | 0.3 |

| Example | Solvent*1 | (A)/(B) Weight Mixing Ratio | Film Thickness (μm) | 180° Peeling Strength (kg/cm) | Curling Properties*2 (cm) |
|---|---|---|---|---|---|
| Example 1 | DMAC | 4/1 | 23 | 1.9 | ∞ |
| Example 2 | DMAC | 10/1 | 26 | 1.8 | ∞ |
| Example 3 | NMP | 4/1 | 25 | 2.5 | 40 |
| Example 4 | NMP | 5/1 | 24 | 2.0 | 25 |
| Example 5 | DMAC | 6/1 | 25 | 1.8 | 30 |
| Example 6 | DMAC | 7/1 | 26 | 1.7 | ∞ |
| Comp. | DMAC | — | 25 | 1.3 | 30 |

TABLE 1-continued

| Example 1 | | | | | |
|---|---|---|---|---|---|
| Comp. Example 2 | NMP | — | 25 | 0.6 | 2.0 |
| Comp. Example 3 | DMAC | — | 28 | 1.0 | 20 |
| Comp. Example 4 | DMAC | 5/1 | 26 | 0.8 | 4.0 |

Notes regarding Table 1
*1: The abbreviations of the respective components represent the following compounds:
S-BPDA: 3,4,3',4'-Bisphenyltetracarboxylic acid dianhydride
PMDA: Pyromellitic acid dianhydride
BTDA: 3,3',4'-Benzophenonetetracarboxylic acid dianhydride
p-PDA: Paraphenylenediamine
m-PDA: Metaphenylenediamine
3,4'-DDE: 3,4'-Diaminodiphenyl ether
4,4'-DDE: 4,4'-Diaminodiphenyl ether
APMS-6: $H_2N-(CH_2)_3Si(CH_3)_2[O-Si(CH_3)_2]_4-OSi(CH_3)_2-(CH_2)_3NH_2$
APMS-10: $H_2N-(CH_2)_3Si(CH_3)_2[O-Si(CH_3)_2]_8-OSi(CH_3)_2-(CH_2)_3NH_2$
APMS-18: $H_2N-(CH_2)_3Si(CH_3)_2[O-Si(CH_3)_2]_{16}-OSi(CH_3)_2-(CH_2)_3NH_2$ p-APS: 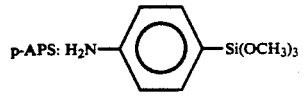

APSE: $H_2N-(CH_2)_3-Si(OEt)_3$
DMAC: N,N-dimethylacetamide
NMP: N-methyl-2-pyrrolidone
*2: Curling properties:
Curling properties were indicated with a curvature radius of the substrate having a size of 10 cm × 10 cm.

What is claimed is:

1. A flexible copper-applied substrate having curling properties of at least 25 cm indicated with a curvature radius of the substrate having a size of 10 cm by 10 cm which comprises a copper foil and a resin layer comprising a composite material of a polyimide having a repeating unit represented by the general formula (I) and a polyimide silicone having a repeating unit represented by the following general formula (II), said resin layer being directly formed on the surface of the copper foil:

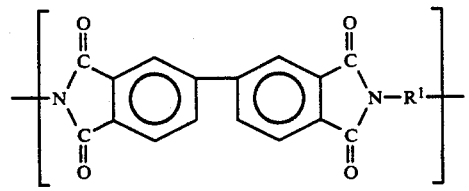 (I)

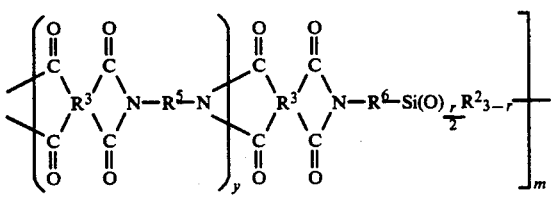

-continued

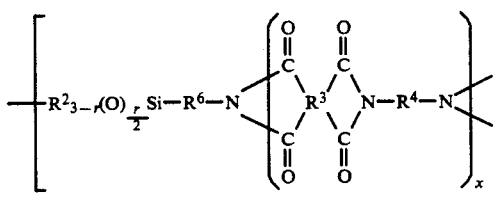

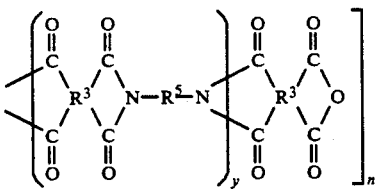 (II)

wherein $R^1$ is an aromatic hydrocarbon group of

$R^2$ is an aliphatic hydrocarbon group having 5 or less carbon atoms or an aromatic hydrocarbon group having 9 or less carbon atoms, $R^3$ is a tetravalent aromatic hydrocarbon group, $R^4$ is a divalent aromatic hydrocarbon group, $R^5$ is divalent siloxane chain, $R^6$ is a divalent aliphatic hydrocarbon group having 3 to 5 carbon atoms or a divalent aromatic hydrocarbon group having 6 to 9 carbon atoms, Y is $-O-$, $-CO-$, $-SO_2-$ or $-CH_2$, r is 2 or 3, x:y is 97:3 to 60:40 and m:n is 50-100:50-0.

2. A flexible copper-applied substrate according to claim 1, wherein $R^1$ is composed of 5 to 30 mole % of

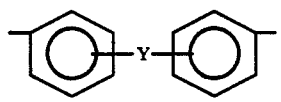

and 70 to 95 mole % of

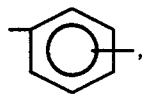

$R^2$ is a methyl group or a phenyl group, and $R^5$ is a group having the formula (V)

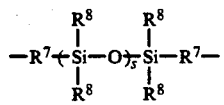

wherein $R^7$ is a divalent aliphatic hydrocarbon group having 3 to 5 carbon atoms or a divalent aromatic hydrocarbon group having 6 to 9 carbon atoms, $R^8$ is an aliphatic hydrocarbon group having 1 to 3 carbon atoms or an aromatic hydrocarbon group having 6 to 9 carbon atoms, Y is —O—, —CO—, —SO$_2$— or —CH$_2$—, and s is an integer of 3 to 150.

3. A process for preparing a flexible copper-applied described in claim 1 which comprises the steps of coating a copper foil with a polyamide acid composite solution prepared by mixing a solution of a polyamide acid having an inherent viscosity of 0.7 to 2 at 30° C. at a concentration of 0.5 g/100 ml in N-methyl-2-pyrrolidone having a repeating unit represented by the general formula (III) with a solution of a polyamide acid alkylsilane having inherent viscosity of 0.05 to 1 at 30° C. at a concentration of 0.5 g/100 ml in N-methyl-2-pyrrolidene, represented by the general formula (IV), and then heating the copper foil coated with the polyamide acid composite solution:

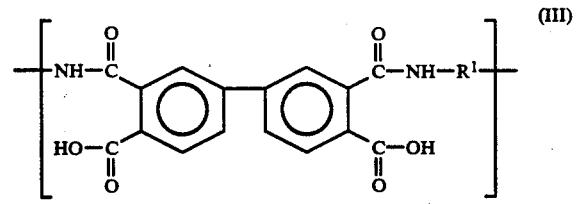

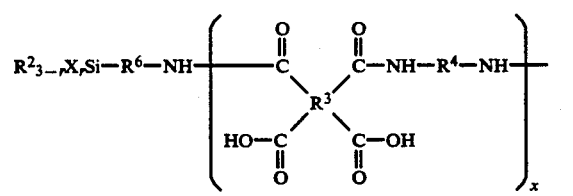

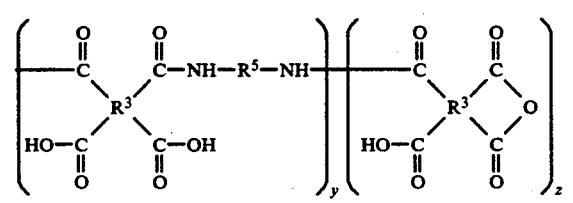

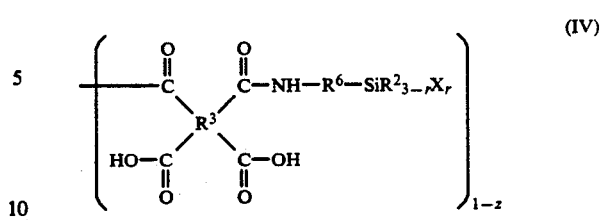

wherein $R^1$ is an aromatic hydrocarbon group of

$R^2$ is an aliphatic hydrocarbon group having 5 or less carbon atoms or an aromatic hydrocarbon group having 9 or less carbon atoms, $R^3$ is a tetravalent aromatic hydrocarbon group, $R^4$ is a divalent aromatic hydrocarbon group, group, $R^5$ is a divalent siloxane chain, $R^6$ is a divalent aliphatic hydrocarbon group having 3 to 5 carbon atoms or a divalent aromatic hydrocarbon group having 6 to 9 carbon atoms, Y is —O—, —CO—, —SO$_2$— or —CH$_2$—, r is 2 or 3, x:y is 97:3 to 60:40, X is a hydrolyzable alkoxy group, an acetoxy group or a halogen, and z is a value of 0 to 0.5.

4. A process for preparing a flexible copper-applied substrate according to claim 3 wherein $R^1$ is composed of 5 to 30 mole % of

and 70 to 95 mole % of

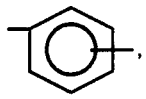

$R^2$ is a methyl group or a phenyl group, and $R^5$ is a group having the formula (V)

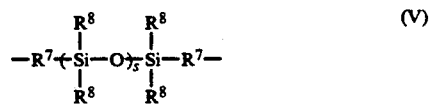

wherein $R^7$ is a divalent aliphatic hydrocarbon group having 3 to 5 carbon atoms or a divalent aromatic hydrocarbon group having 6 to 9 carbon atoms, $R^8$ is an aliphatic hydrocarbon group having 1 to 3 carbon atoms or an aromatic hydrocarbon group having 6 to 9 carbon atoms, Y is —O—, —CO—, —SO$_2$— or —CH$_2$—, and s is an integer of 3 to 150.

5. A process for preparing the flexible copper-applied substrate set forth in claim 1 which comprises the steps of:
   (i) coating a surface of a copper foil with a polyamide acid composite solution that is an admixture of:

(a) a solution of E moles of a polyamide acid having repeating units of the general formula (III),

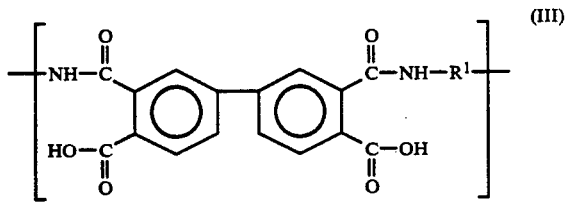

prepared by dissolving a phenylene diamine of the general formula (VII),

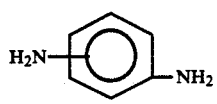

and an aromatic diamine of the general formula (VIII),

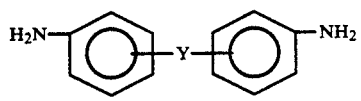

in a polar organic solvent, adding to the resultant mixture a 3, 4, 3', 4'-biphenyltetracarboxylic acid dianhydride which is equimolar to the above-mentioned diamines and reacting them at a temperature of 0°–80° C. for 1–24 hours, and (b) a solution of F moles of a polyamide acid alkyl silane of the formula (IV),

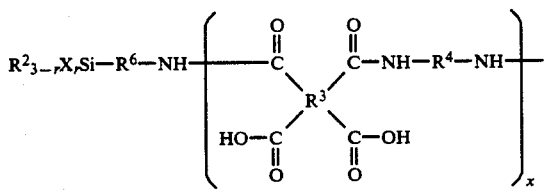

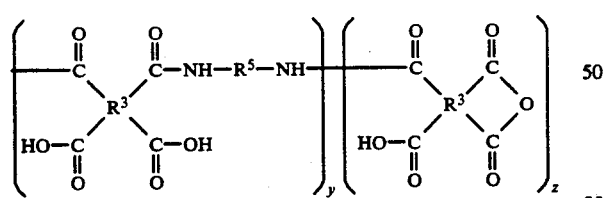

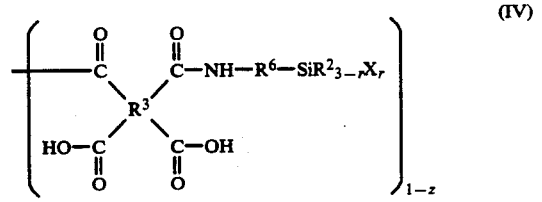

(c) E and F satisfying the equation that F/(E+F)=0.02 to 0.50, and (ii) subjecting the copper foil thus coated to heat treatments at 100°–200° C. for 10–90 min. and then at 200°–350° C. for 10–270 min. wherein $R^1$ is an aromatic hydrocarbon group of

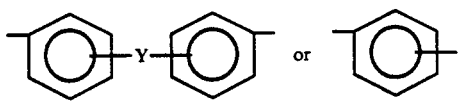

and $R^2$ is an aliphatic hydrocarbon group having 5 or less carbon atoms or an aromatic hydrocarbon group having 9 or less carbon atoms, $R^3$ is a tetravalent aromatic hydrocarbon group, $R^4$ is a divalent aromatic hydrocarbon group, $R^5$ is a divalent siloxane chain, $R^6$ is a divalent aliphatic hydrocarbon group having 3 to 5 carbon atoms or a divalent aromatic hydrocarbon group having 6 to 9 carbon atoms, Y is —O—, —CO—, —SO$_2$— or —CH$_2$—, r is 2 or 3, x:y is 97:3 to 60:40 X is a hydrolyzable alkoxy group, an acetoxy group or a halogen, and z is a value of 0 to 0.5.

6. A process according to claim 5 wherein said polyamide acid alkyl silane of the formula (IV) is prepared by dissolving B moles of an aromatic diamine of the general formula (X),

C moles of a diamine of the general formula (XI'),

and D moles of an aminoalkyl silane of the general formula (XII),

in an organic solvent, adding to the resulting mixture A moles of an aromatic tetracarboxylic acid dianhydride of the general formula (IX),

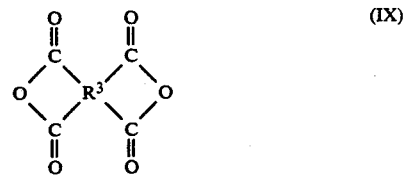

and reacting at a temperature of 1°–80° C. for 1–24 hours, where A, B, C and D satisfy the relations in formulas (XV) to (XVII), $$1 \leq \frac{D}{A - (B + C)} \leq 2 \quad \text{(XV)}$$

$$0.001 \leq \frac{D}{2B + 2C + D} \leq 0.1 \quad \text{(XVI)}$$

$$0.03 \leq \frac{C}{B + C} \leq 0.40. \quad \text{(XVII)}$$

7. A process according to claim 5 wherein said polyamide acid alkyl silane of the formula (IV) is prepared by dissolving B moles of an aromatic diamine having the general formula (X)

and C moles of a diamine of the formula

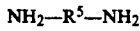

in an organic solvent, adding A moles of an aromatic tetracarboxylic acid dianhydride of the formula

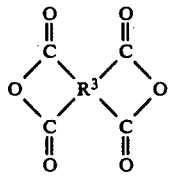

(IX)

to the resulting mixture to cause the reaction, then adding D moles of an aminoalkyl silane having the formula $$H_2N-R^6-SiR^2{}_{3-r}X_r \quad (XII)$$

thereto to cause the reaction where A, B, C and D satisfy the relations in formulas (XV) to (XVII), $$1 \leq \frac{D}{A - (B + C)} \leq 2 \quad (XV)$$

$$0.001 \leq \frac{D}{2B + 2C + D} \leq 0.1 \quad (XVI)$$

$$0.03 \leq \frac{C}{B + C} \leq 0.40. \quad (XVII)$$

8. A process according to claim 5 wherein $R^1$ is composed of 5 to 30 mole % of

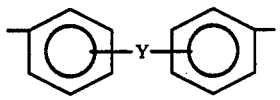

and 70 to 95 mole % of

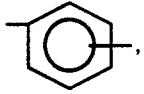

$R^2$ is a methyl group or a phenyl group, and $R^5$ is a group having the formula (V)

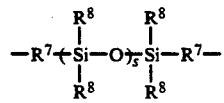

(V)

wherein $R^7$ is a divalent aliphatic hydrocarbon group having 3 to 5 carbon atoms or a divalent aromatic hydrocarbon group having 6 to 9 carbon atoms, $R^8$ is an aliphatic hydrocarbon group having 1 to 3 carbon atoms or an aromatic hydrocarbon group having 6 to 9 carbon atoms, Y is —O—, —CO—, —SO$_2$— or —CH$_2$—, and s is an integer of 3 to 150.

* * * * *